(12) United States Patent
Chansarkar

(10) Patent No.: US 7,953,142 B2
(45) Date of Patent: May 31, 2011

(54) VARIABLE CODE-TRACKING LOOP WITH IMPROVED SIGNAL DYNAMICS, LOOP NOISE, AND SENSITIVITY

(75) Inventor: Mangesh Chansarkar, Irvine, CA (US)

(73) Assignee: Sirf Technology, San Jose, CA (US)

( * ) Notice: Subject to any disclaimer, the term of this patent is extended or adjusted under 35 U.S.C. 154(b) by 386 days.

(21) Appl. No.: 10/493,150

(22) PCT Filed: Oct. 17, 2002

(86) PCT No.: PCT/US02/33529
§ 371 (c)(1),
(2), (4) Date: Oct. 13, 2004

(87) PCT Pub. No.: WO03/034090
PCT Pub. Date: Apr. 24, 2003

(65) Prior Publication Data
US 2005/0041724 A1   Feb. 24, 2005

Related U.S. Application Data

(60) Provisional application No. 60/330,225, filed on Oct. 17, 2001.

(51) Int. Cl.
*H04B 1/707* (2011.01)
(52) U.S. Cl. ........ 375/149; 375/136; 375/142; 375/145; 375/147; 375/150; 375/316; 375/340; 375/343; 375/354; 375/362; 375/367; 375/368; 375/371; 375/375; 455/502; 455/516; 370/509; 370/510; 327/141; 327/147; 327/156

(58) Field of Classification Search .......... 375/326, 375/327, 354, 367, 373, 375, 376, 136, 142, 375/145, 147, 149, 150, 316, 340, 343, 362, 375/368, 371; 329/345; 327/147, 156, 141; 455/502, 516; 370/509, 510
See application file for complete search history.

(56) References Cited

U.S. PATENT DOCUMENTS

| | | | |
|---|---|---|---|
| 4,285,060 A * | 8/1981 | Cobb et al. ............... 375/376 |
| 4,691,176 A * | 9/1987 | Hsiung et al. ............... 331/2 |
| 5,060,180 A * | 10/1991 | Kingston et al. .......... 708/306 |
| 5,477,195 A * | 12/1995 | Spilker ..................... 331/11 |
| 5,577,080 A * | 11/1996 | Sakaue et al. ............ 375/376 |
| 5,589,795 A * | 12/1996 | Latva-Aho ................ 327/553 |
| 5,737,362 A * | 4/1998 | Hyun et al. ............... 375/149 |
| 5,901,183 A * | 5/1999 | Garin et al. ............... 375/343 |
| 6,313,789 B1 * | 11/2001 | Zhodzishsky et al. ... 342/357.12 |
| 6,498,929 B1 * | 12/2002 | Tsurumi et al. ............ 455/296 |
| 6,965,616 B1 * | 11/2005 | Quigley et al. ............ 370/480 |
| 2004/0163120 A1 * | 8/2004 | Rabenko et al. ............ 725/111 |

* cited by examiner

*Primary Examiner* — Leon Flores
(74) *Attorney, Agent, or Firm* — Mark J. Danielson; Pillsbury Winthrop Shaw Pittman LLP

(57) ABSTRACT

A variable code-tracking loop filter in a receiver having the ability to change its parameters multiple times in response to received signals. Parameters for the code-tracking loop filter may be varied based on phase and frequency errors from an error detector. In one implementation, the code-tracking loop filter is able to repeatedly vary a single parameter, such as its received bandwidth, based on the phase and frequency errors, while in another, the code-tracking loop filter may vary two or more parameters, such as the loop bandwidth and the natural frequency.

11 Claims, 3 Drawing Sheets

VARIABLE CODE-TRACKING LOOP WITH IMPROVED SIGNAL DYNAMICS, LOOP NOISE, AND SENSITIVITY

CROSS-REFERENCE TO RELATED APPLICATIONS

This application claims the benefit of Provisional Patent Application Ser. No. 60/330,225, filed on Oct. 17, 2001, and entitled "VARIABLE BANDWIDTH CODE-TRACKING LOOP FOR IMPROVED SIGNAL DYNAMICS, LOOP NOISE, AND SENSITIVITY," which is herein incorporated by reference.

BACKGROUND OF THE INVENTION

1. Field of the Invention

This invention relates generally to filters in connection with a wireless communication device and more practically to code-tracking loops.

2. Related Art

A Satellite Positioning System (SPS) receiver such as a Global Positioning System (GPS) receiver converts a received spread spectrum IF signal to a signal of a lower frequency. This lower frequency signal is obtained by mixing the received signal with a pure sinusoidal signal generated by a local oscillator. The frequency of the sinusoidal signal is the difference between the original (Doppler-shifted) received carrier frequency and the local oscillator signal. The lower frequency signal is then processed by signal tracking circuits in the GPS device.

A common class of signal processing techniques that is used to track carrier phase includes "code-correlating" approaches. Code-correlating receivers use tracking loops or tracking loop filters to extract the necessary measurements and navigation message data from the lower frequency signal. A typical GPS receiver contains two types of tracking loops; a code-tracking loop filter and a carrier-tracking loop.

The code-tracking loop filter, such as a Kalman filter is used to align the pseudo code (commonly called P-code) sequence contained in the received signal from one of a plurality of satellites with an identical P-code generated within the receiver. A correlator in the delay-lock loop continuously cross-correlates the two P-code sequences, time shifting the receiver-generated stream until alignment is achieved resulting in a pseudo-range determination. Once the code-tracking loop is aligned, the P-code can be removed from the received spread spectrum IF signal from the satellite. The stripped signal then passes to a phase-lock loop where the satellite message is extracted. Upon a local oscillator locking onto the received satellite signal it will be adjusted to follow the variations in the phase of the carrier as the GPS receiver distance changes. The integrated carrier frequency phase is obtained by simply counting the whole elapsed cycles by noting the "zero crossings" of the sinusoidal signal generated by the local oscillator and measuring the fractional phase of the locked local oscillator signal.

The capabilities of a typical code-tracking loop filter including the "pull in" performance for initial errors, Loop Noise and Dynamics handling, is controlled by the set bandwidth of the tracking loop. The first order code-tracking loop filter, which is the most common of the code-tracking loop filters, is implemented with a constant gain factor. The "pull in" will be faster if the loop bandwidth is higher, but the Loop Noise is also higher if the loop bandwidth is higher. A higher bandwidth loop enables the code-tracking loop to handle higher signal dynamics and results in lower sensitivity (lose lock at higher CNO) due to the higher Loop Noise. Previous approaches have improved noise performance and sensitivity by using lower bandwidth tracking loops that result in the loss of the ability to track high dynamics in addition to the "pull in" capabilities being lost.

In order to overcome the limits on bandwidth, a second tracking loop is often used with the higher bandwidth code-tracking loop. The higher bandwidth loop is used to pull in the signals. Once acquired, the low bandwidth loop then tracks the signal. But, such designs have the limitation of allowing the transition from an initial bandwidth loop to the lower bandwidth loop to occur only once.

One common tracking loop filter is a Kalman filter. The Kalman filter response is based on a system's dynamic and noise model. But, the drawback of using such known filters is that the filters are computationally expensive and require more processing memory and power in addition to being non-variable.

Thus, there is a need in the art for a tracking loop filter that is able to overcome limitations of known bandwidth tracking loops and that are not computationally expensive.

SUMMARY

The present invention describes a dynamic code-tracking loop filter that overcomes the limitations of the prior art. The dynamic code-tracking loop filter is not a fixed parameter filter and any parameter of the filter may be varied based on phase and frequency errors. The dynamic code-tracking loop filter may be a variable bandwidth code-tracking loop. The variable bandwidth code-tracking loop is able to repeatedly vary the received bandwidth of a code-tracking loop. A control law with minimal extra computation controls the bandwidth of the dynamic code-tracking loop with an improved tradeoff between processor memory and power requirements.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principles of the invention. Moreover, in the figures, like reference numerals designate corresponding parts throughout the different views.

DETAILED DESCRIPTION

Figure 1:
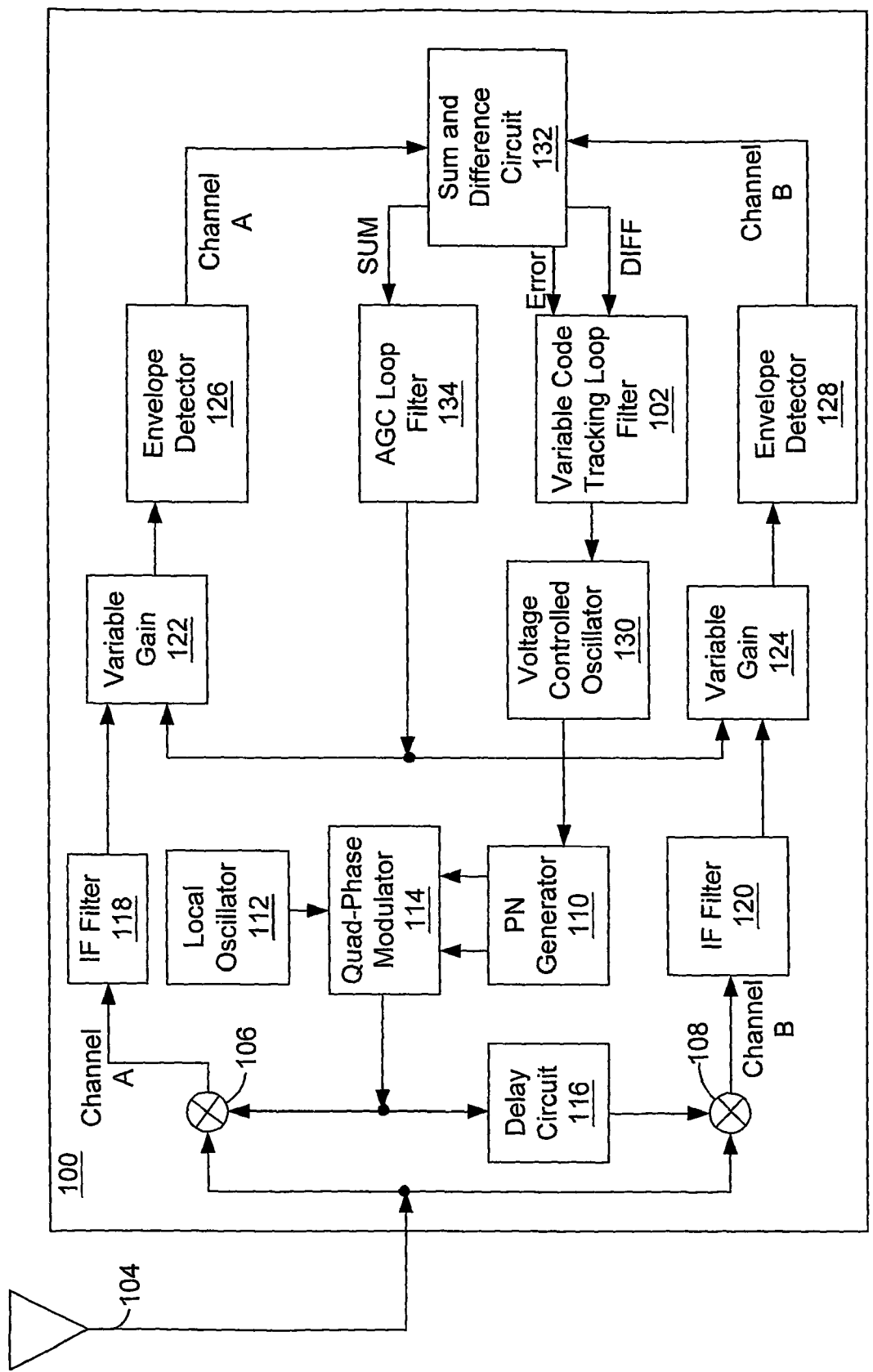
FIG. 1 is a block diagram of timing control circuit in a GPS receiver having a Variable Code-Tracking Loop Filter.

In FIG. 1, a block diagram of a timing control circuit in a GPS receiver 100 having a Variable Code-Tracking Loop Filter 102 is shown. An incoming spread spectrum IF signal containing the transmitted pseudo-noise (PN) code with which the locally generated PN code is to be synchronized is distributed from an Antenna 104 to a pair of Mixers 106 and 108. In each of the Mixers 106 and 108, the incoming spread spectrum IF signal is combined with a PN signal code locally produced by PN Code Generator 110, Local Oscillator 112 and Quad-phase Modulator 114. To provide a relative phase offset between the codes applied to mixers 106 and 108, a delay circuit 116 is inserted in the signal path between the output of the Quad-phase Modulator 114. The output of Mixers 106 and 108 are filtered by IF Filters 118 and 120, respectively, and applied via a pair of Variable Gain Amplifiers 122 and 124, respectively, to Envelope Detectors 126 and 128 respectively. The outputs of Envelope Detectors 126 and 128 represent the degree of correlation of the PN code contained in the received spread spectrum signal with the pair of relatively offset PN codes generated at the receiver for channels A and B, respectively.

The clock control input of PN Generator 110 is supplied from Voltage Controlled Oscillator (VCO) 130, input of which is in signal communication with the output of the Variable Code-Tracking Loop Filter 102. In an alternate embodiment, the VCO 130 may be a numerical controlled oscillator (NCO). The input to the Variable Code-Tracking Loop Filter 102 is in signal communication with a difference output port of a Sum and Difference Circuit 132. The sum output port of the Sum and Difference Circuit 132 is coupled through an Automatic Gain Control Loop Filter 134 to the gain control inputs of the Variable Gain Amplifiers 122 and 124.

The VCO 130 output is set such that the PN sequence produced at the output of Quad-phased Modulator 114 is adjusted relative to the PN code contained in the incoming spread spectrum IF signal by a prescribed time differential+ $\Delta T/2$. The delay provided by Delay Circuit 116 is equal to a time differential $\Delta T$ so that the PN code appearing at the output of Delay Circuit 116 lags relative to the PN code contained in the incoming spread spectrum IF signal by a time differential $-\Delta T/2$. Therefore, for equal gains through the two channels A and B, the outputs of the Envelope Detectors 126 and 128 will be equal when the locally generated PN code inputs to Mixers 106 and 108 are equally shifted about the maximum correlation timing position.

Unlike known code-tracking loop filters, the Variable Code-Tracking Loop Filter 102 is able to change the loop noise and dynamic handling capabilities of the code-tracking loop by adjustment in the bandwidth of the loop. The Variable Code-Tracking Loop Filter 102 may reduce its bandwidth to improve noise performance and sensitivity once an initial "pull in" has been achieved.

The adjustments in the Variable Code-Tracking Loop Filter 102 are done in response to determined errors in phase and frequency. The Sum and Difference Circuit 132 also may include an error detector that communicates phase and frequency errors to the Variable Code-Tracking Loop Filter 102.

Figure 2:
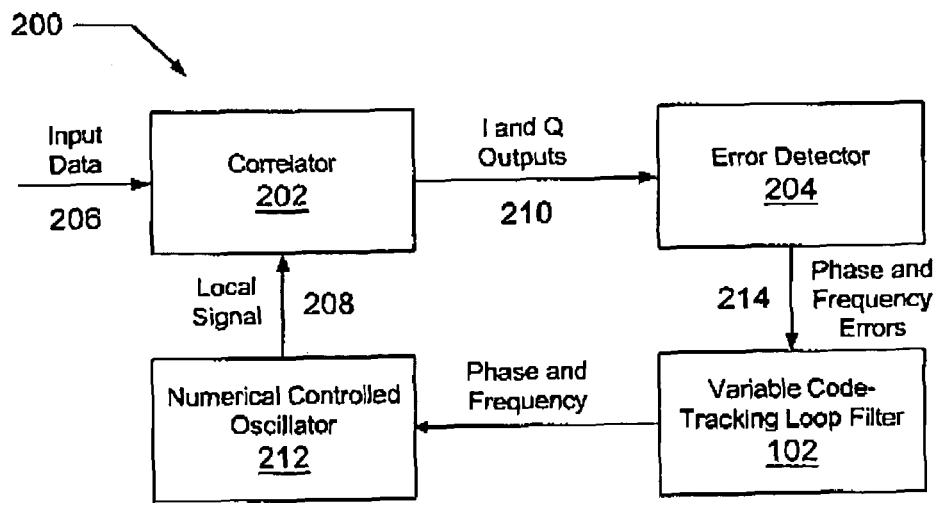
FIG. 2 is a block diagram of a variable code-tracking loop using the Variable Code-Tracking Loop Filter of FIG. 1.

Turning to FIG. 2, a block diagram of a variable code-tracking loop 200 using the Variable Code-Tracking Loop Filter 102 of FIG. 1 is shown. FIG. 2 shows the variable code-tracking loop in a digital domain. Therefore, rather than receiving signals, data is received and processed. Digital-to-analog and analog-to-digital converters may be used to transition between the analog domain and the digital domain.

In a GPS receiver 100, digitized input samples of the spread spectrum IF signal typically arrive at the rate of 2-8 Mega samples per second and are quantized at 1 or 2 bit levels. The local signal 208 is a locally generated replica of the input signal. The data is generated at the same rate as the input data 206 and is quantized similarly to the input data 206. Typically the local signal 208 is generated in two streams, an In Phase stream and Quadrature Phase stream.

A Correlator 202, such as the Sum and Difference Circuit 132 of FIG. 1 receives an analog signal and make a correlation between two channels. Other correlations that may occur in other embodiments include a correlation between a received spread spectrum IF signal and a local generated signal and occur in the digital domain.

The Correlator 202 input data 206 is in the digital domain. The input data 206 is multiplied by the local signal 208 and the result is added for a specified period of time. When the input signal is multiplied by the In Phase stream the result is termed the "I" output and the signal multiplied by the Quadrature Phase stream is termed the "Q" output. The "I" and "Q" outputs are generated at a slower rate than the input data 206 and the local signal 208. Typically the "I" and "Q" 210 outputs are generated at 50 samples per second to 1000 samples per second. The "I" and "Q" outputs 210 represent information about the phase and frequency errors 214 between the input data 206 and the local signal 208. The "I" and "Q" outputs 210 are passed from the Correlator 202 to the Error Detector 204.

The Error Detector 204 is a function/computation which operates on "I" and "Q" outputs 210 from the Correlator 202 and determines the phase and frequency errors 214. The phase and frequency errors 214 are the estimates of the phase error and the frequency error between the input data 206 and the local signal 208 based on the "I" and "Q" outputs 210. The phase and frequency errors are typically generated at the rate at which the "I" and "Q" outputs are generated.

The Variable Code-Tracking Loop Filter 102 receives the phase and frequency error from the Error Detector 204. The Variable Code-tracking Loop Filter 102 processes the phase and frequency errors of the input data and adjusts the Numerical Controlled Oscillator (NCO) 212 accordingly. The Variable Code-Tracking Loop Filter 102 smoothes the phase and frequency error estimates in order to reduce noise.

Unlike known code-tracking loop filters, the Variable Code-Tracking Loop Filter 102 is not a fixed parameter filter. Any parameter for the filter may be varied based on the phase and frequency errors received from the Error Detector 204. In the described first order Variable Code-Tracking Loop Filter 102, the bandwidth is the only parameter available to be varied. In an alternate embodiment, a second order variable code-tracking loop filter may vary both the loop bandwidth and natural frequency. Similarly more parameters may be varied for higher order variable code-tracking loop filters.

The Variable Code-Tracking Loop Filter 102 is typically at its maximum bandwidth during initial acquisition of the P-codes in the incoming spread spectrum IF signal. Maximum bandwidth is defined as the bandwidth that would normally be used in known code-tracking loop filters. Upon acquisition of the incoming signal and reduction in the phase and frequency errors being determined by the Error Detector 204, the Variable Code-Tracking Loop Filter 102 reduces its bandwidth resulting in an improvement in noise performance and sensitivity. If the detected error in the phase and frequency increase, the Variable Code-Tracking Loop Filter 102 then increases its bandwidth.

The NCO 212 is an oscillator that generates the local signal for input to the Correlator 202. The NCO 212 receives phase and frequency adjustments from the Variable Code-Tracking Loop Filter 102 and changes the local signal accordingly. The local signal generated by the NCO 212 is typically controlled by a counter, which is determined by a step of the counter.

Figure 3:
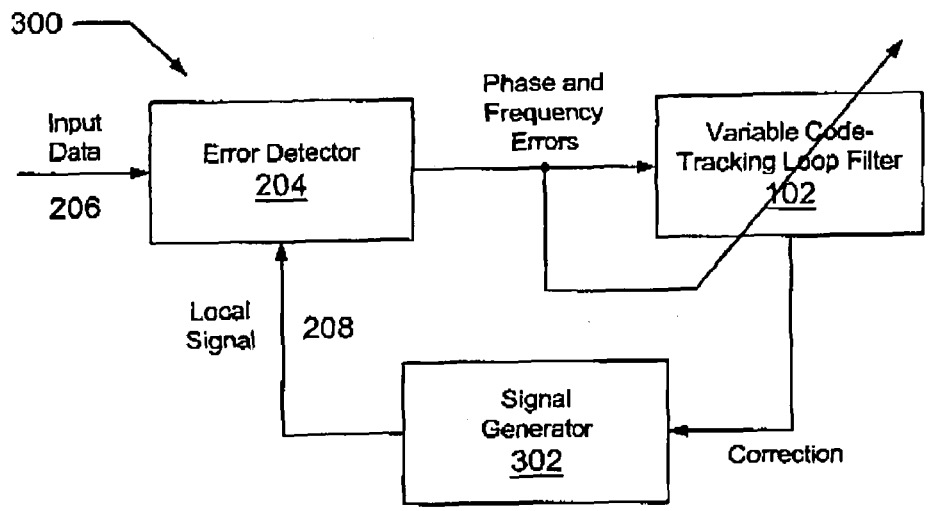
FIG. 3 is a signal diagram of the variable code-tracking loop of FIG. 2.

In FIG. 3, a signal diagram 300 of the Variable Code-Tracking Loop Filter 102 of FIG. 2 is shown. An Error Detector 204 receives input data and determines phase and frequency errors. The phase and frequency errors are sent to the Variable Code-Tracking Loop Filter 102. The Variable Code-Tracking Loop Filter 102 processes the received phase and frequency errors to generate a correction for the Signal Generator 302. The Variable Code-Tracking Loop Filter 102 also uses the phase and frequency error to adjust its bandwidth. Thus, the Variable Code-Tracking Loop Filter 102 is in one operating state and adjusts its bandwidth so the Variable Code-Tracking Loop Filter 102 is in another operating state having a different bandwidth. In alternate embodiments, other parameters may be generated and used by a higher order Variable Code-Tracking Loop Filter 102.

The Signal Generator 302 generates the local signal used by the Error Detector 204 when determining phase and frequency errors between the input data and the local signal. The signal Generator 302 adjusts the local signal in response to the corrections generated by the Variable Code-Tracking Loop Filter 102.

More specifically, the Variable Code-Tracking Loop Filter 102 has update equations for the first order code loop as follows:

$$C(n+1) = C(n) + K(n)*e(n)$$

Where
n=Time Index.
C(n)=Code Phase at time index n
K(n)=Loop Gain at time index n
e(n)=Error estimate at time index n The Loop gain K(n) can be updated using various update equations for example:
The Loop gain is updated using the equation:

$$K(n) = a*K(n-1) + b*e(n)*e(n)$$

If (K(n)>Kmax), K(n)=Kmax
If (K(n)<Kmin), K(n)=Kmin
And the Gain is initialized as $$K(0) = K\text{max}$$

where Kmax is the maximum gain and Kmin is the minimum gain.

Furthermore, a and b are tuning parameters that should be fixed at design time based on performance requirements. The values for a and b can be chosen from 0<a<1 and 0<b<1. When a=1 and b=0 this will be the fixed bandwidth/gain loop and will be identical to the typical loop.

The Variable Code-Tracking Loop Filter 102 is implemented using a general-purpose processor, such as made by Intel or Motorola. In other embodiments, an application specific integrated circuit (ASIC), digital signal processor, and digital controller may be utilized. Further, digital logic circuits, analog components, or a combination of both may implement a state machine to function as a digital controller.

A variable code-tracking loop filter in a receiver having the ability to change its parameters multiple times in response to received signals. Parameters for the code-tracking loop filter may be varied based on phase and frequency errors from an error detector. In one implementation, the code-tracking loop filter is able to repeatedly vary a single parameter, such as its received bandwidth, based on the Phase and frequency errors, while in another, the code-tracking loop filter may vary two or more parameters, such as the loop bandwidth and the natural frequency.

The Variable Code-Tracking Loop Filter 102 is implemented using a general-purpose processor, such as made by Intel or Motorola. In other embodiments, an application specific integrated circuit (ASIC), digital signal processor, digital controller. Further, digital logic circuits, analog components, or a combination of both may implement a state machine to function as a digital controller.

Figure 4:
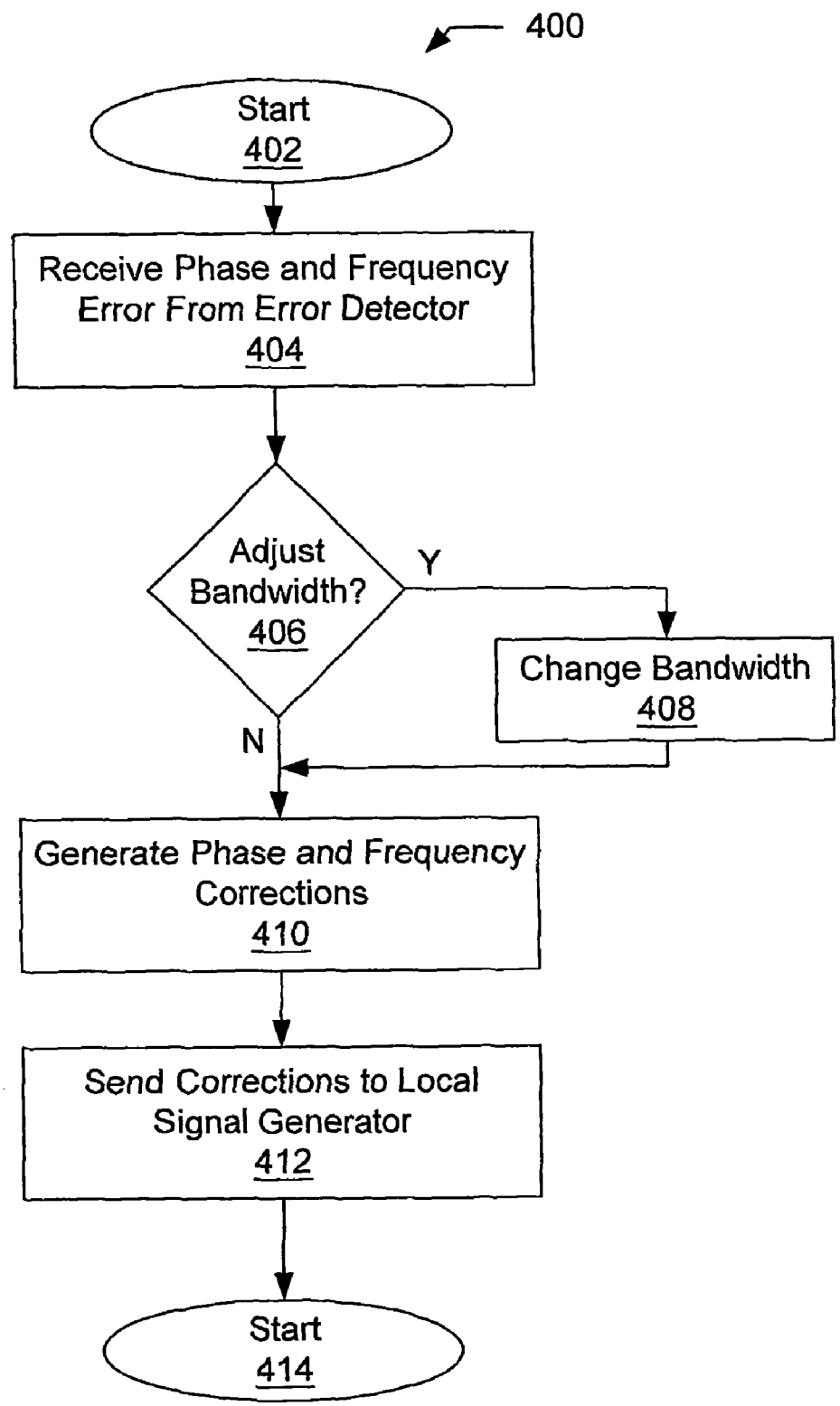
FIG. 4 is a flow diagram of a process of Variable Code-Tracking Loop Filter of FIG. 2.

Turning next to FIG. 4, a flow diagram of a process 400 for implementing the Variable Code-Tracking Loop Filter 102 of FIG. 2 is shown. The process starts 402 with the Variable Code-Tracking Loop Filter 102 receiving the phase and frequency error 404 from an Error Detector 204. The phase error and the frequency error are each an example of a detected parameter. The Variable Code-Tracking Loop Filter 102 determines if a predetermined level of phase and frequency error is achieved signaling an adjustment in bandwidth 406. If an adjustment is required 406, than the bandwidth of the Variable Code-Tracking Loop Filter 102 is changed in response to the phase and frequency error. Otherwise, the Variable Code-Tracking Loop Filter 102 generates phase and frequency corrections 410. The phase and frequency corrections are then sent 412 to the signal generator 302. Processing is shown as completing in step 414, but in reality the process is a feedback system and is iterative.

The process in FIG. 4 may be performed by hardware or software. If the process is performed by software, the software may reside in software memory (not shown) in the wireless device or wireless network. The software in memory may include an ordered listing of executable instructions for implementing logical functions (i.e., "logic" that may be implement either in digital form such as digital circuitry or source code or in analog form such as analog circuitry or an analog source such an analog electrical, sound or video signal), may selectively be embodied in any computer-readable (or signal-bearing) medium for use by or in connection with an instruction execution system, apparatus, or device, such as a computer-based system, processor-containing system, or other system that may selectively fetch the instructions from the instruction execution system, apparatus, or device and execute the instructions. In the context of this document, a "computer-readable medium" and/or "signal-bearing medium" is any means that may contain, store, communicate, propagate, or transport the program for use by or in connection with the instruction execution system, apparatus, or device. The computer readable medium may selectively be, for example but not limited to, an electronic, magnetic, optical, electromagnetic, infrared, or semiconductor system, apparatus, device, or propagation medium. More specific examples "a non-exhaustive list" of the computer-readable medium would include the following: an electrical connection "electronic" having one or more wires, a portable computer diskette (magnetic), a RAM (electronic), a read-only memory "ROM" (electronic), an erasable programmable read-only memory (EPROM or Flash memory) (electronic), an optical fiber (optical), and a portable compact disc read-only memory "CDROM" (optical). Note that the computer-readable medium may even be paper or another suitable medium upon which the program is printed, as the program can be electronically captured, via for instance optical scanning of the paper or other medium, then compiled, interpreted or otherwise processed in a suitable manner if necessary, and then stored in a computer memory.

While various embodiments of the application have been described, it will be apparent to those of ordinary skill in the art that many more embodiments and implementations are possible that are within the scope of this invention. Accordingly, the invention is not to be restricted except in light of the attached claims and their equivalents.

What is claimed is:
1. A method for varying operating states of a variable code-tracking loop, comprising: generating, by a local signal generator, a local signal corresponding to a pseudo code; detecting at least one parameter of an error in the pseudo code between the local signal and an incoming signal; determining in a processor that a threshold has been reached by the at least one detected parameter of the error in the pseudo code between the local signal and an incoming signal; changing from a first operating state of the variable code-tracking loop to a second operating state in response to the threshold being reached; generating a correction signal in response to the at least one detected parameter; transmitting the correction signal to a the local signal generator; determining that the threshold is not reached; and reverting back to the first operating state from the second operating state upon the threshold not being reached.

2. The method of claim 1, where determining further includes receiving a phase error as the at least one detected parameter.

3. The method of claim 1, where determining further includes receiving a frequency error as the at least one detected parameter.

4. The method of claim 1, where changing further includes:
operating at a first bandwidth in the first operating state; and
operating at a second bandwidth in the second operating state.

5. The method of claim 1, further including the steps of:
generating an adjusted local signal at the local signal generator;
transmitting the adjusted local signal to an error detector; and
determining at least one additional detected parameter at the error detector utilizing the Input data and the adjusted local signal.

6. The method of claim 5, further including the step of repeating the steps of claim 1.

7. An apparatus for a variable code-tracking loop, comprising: means for generating a local signal corresponding to a pseudo code; means for detecting at least one parameter of an error in the pseudo code between the local signal and an incoming signal; means for determining in a processor that a threshold has been reached by the at least one detected parameter of the error in the pseudo code between the local signal and an incoming; means for changing from a first operating state of the variable code-tracking loop to a second operating state in response to the threshold being reached; means for generating a correction signal in response to the at least one detected parameter; means for transmitting the correction signal to a the means for generating the local signal; means for determining that the threshold is not reached; and means for reverting back to the first operating state from the second operating state upon the threshold not being reached.

8. The apparatus of claim 7, further including means for receiving a phase error as the at least one detected parameter.

9. The apparatus of claim 7, further including means for receiving a frequency error as the at least one detected parameter.

10. The apparatus of claim 7, further including:
means for operating at a first bandwidth in the first operating state; and
means for operating at a second bandwidth in the second operating state.

11. The apparatus of claim 7, further including:
means for generating an adjusted local signal at the local signal generator;
means for transmitting the adjusted local signal to an error detector; and
means for determining at least one additional detected parameter at the error detector utilizing the input data and the adjusted local signal.

* * * * *

UNITED STATES PATENT AND TRADEMARK OFFICE
CERTIFICATE OF CORRECTION

PATENT NO.       : 7,953,142 B2
APPLICATION NO.  : 10/493150
DATED            : May 31, 2011
INVENTOR(S)      : Chansarkar Page 1 of 1

It is certified that error appears in the above-identified patent and that said Letters Patent is hereby corrected as shown below:

On the Title Page, in Field (73), under "Assignee", in Column 1, Line 1, delete "Sirf Technology," and insert -- Sirf Technology Inc., --, therefor.

In Column 3, Line 8, delete "output" and insert -- outputs --, therefor.

In Column 5, Line 46, below "typical loop." insert -- The loop is initialized to maximum gain so the initial pull in is fast. As the loop pulls in the error estimate goes down and so does the gain due to the parameters a and b being less than 1. This causes the loop noise to go down as the loop pulls in. The gain will settle at a low value based on the noise estimate. For better sensitivity of the loop the b should be chosen small so that the loop stays at a small bandwidth / gain. When the signal dynamics change the error estimate is larger and that will drive the gain higher so that the loop can track the movement in the signal. The Kmax and Kmin govern the loop stability and performance bounds. --.

In Column 5, Lines 54-63, delete "A variable code-tracking ..... frequency.".

In Columns 5 & 6, Lines 64-67 & 1-3, delete "The Variable ..... controller.".

In Column 7, Line 11, in Claim 5, delete "a the" and insert -- the --, therefor.

In Column 8, Line 13, in Claim 5, delete "a the" and insert -- the --, therefor.

In Column 8, Claim 7, Lines 6-7, after "incoming" insert -- signal --.

In Column 8, Claim 7, Line 11 to read: means for transmitting the correction signal to a~~ the means for generating the local signal;

Signed and Sealed this
Twenty-sixth Day of March, 2013

Teresa Stanek Rea
*Acting Director of the United States Patent and Trademark Office*